United States Patent
Mukoyama et al.

(10) Patent No.: US 7,352,787 B2
(45) Date of Patent: Apr. 1, 2008

(54) VERTICAL CAVITY SURFACE EMITTING LASER DIODE AND PROCESS FOR PRODUCING THE SAME

(75) Inventors: Naotaka Mukoyama, Ebina (JP); Nobuaki Ueki, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 466 days.

(21) Appl. No.: 11/009,057

(22) Filed: Dec. 13, 2004

(65) Prior Publication Data
US 2005/0286596 A1    Dec. 29, 2005

(30) Foreign Application Priority Data
Jun. 29, 2004    (JP)    ............... 2004-191855

(51) Int. Cl.
*H01S 5/00*    (2006.01)
(52) U.S. Cl. ............... 372/43.01; 372/45.01; 372/46.01
(58) Field of Classification Search ............. 372/43.01, 372/46.01, 46.013
See application file for complete search history.

(56) References Cited

U.S. PATENT DOCUMENTS 5,633,527 A * 5/1997 Lear ............... 257/432
6,728,289 B1 * 4/2004 Peake et al. ............... 372/101
6,940,885 B1 * 9/2005 Cheng et al. ............... 372/50.1

FOREIGN PATENT DOCUMENTS

JP    A-2000-076682    3/2000
JP    A-2004-063707    2/2004

OTHER PUBLICATIONS

John S. Gustavsson et al.; "High Speed Digital Modulation Characteristics of Oxide-Confined Vertical-Cavity Surface-Emitting Lasers—Numerical Simulations Consistent with Experimental Results"; IEEE *Journal of Quantum Electronics*; vol. 38, No. 8, Aug. 2002; pp. 1089-1096.

* cited by examiner

*Primary Examiner*—Dung (Michael) T. Nguyen
(74) *Attorney, Agent, or Firm*—Oliff & Berridge, PLC

(57) ABSTRACT

A vertical cavity surface emitting laser diode includes a lower semiconductor reflector, an active region, an upper semiconductor reflector constituting a resonator with the lower semiconductor reflector, a metallic part being formed on the upper semiconductor reflector, which has a first aperture defining an output region of laser light generated in the active region, and a light confining region being provided between the metallic part and the lower semiconductor reflector, and having a second aperture defining an emission region of the laser light. The upper semiconductor reflector includes a lenticular medium having a convex surface toward the lower semiconductor reflector.

15 Claims, 8 Drawing Sheets

VERTICAL CAVITY SURFACE EMITTING LASER DIODE AND PROCESS FOR PRODUCING THE SAME

BACKGROUND OF THE INVENTION

1. Field of the Invention

The present invention relates to a vertical cavity surface emitting laser diode, and more particularly, it relates to a vertical cavity surface emitting laser diode used as a light source for optical information processing and optical communication and a light source for a data storage device storing data with light.

2. Description of the Related Art

A vertical cavity surface emitting laser diode (hereinafter, referred to as VCSEL) is a laser diode that emits light from a surface of a semiconductor substrate and has such characteristic features as (1) a low driving voltage, (2) capability of wafer level characteristic examination and (3) easiness in implementation, as compared to an edge emitting laser diode.

As shown in FIG. 14, a VCSEL has a substrate 2 having a lower electrode 1 formed thereon, and on the substrate 2, semiconductor thin films including a lower semiconductor multi-layer reflector 3, an active region 4, an AlAs layer 5 and an upper semiconductor multi-layer reflector 6 accumulated in this order. The uppermost layer of the upper semiconductor multi-layer reflector 6 is a contact layer 7, and an upper electrode 8 is disposed thereon through the contact layer 7. An aperture 9 in a circular shape determining an emission window of laser light is formed at the center of the upper electrode 8. A mesa or post 10 in a cylindrical shape is formed on the substrate 2 from the upper semiconductor multi-layer reflector 6 to a part of the lower semiconductor multi-layer reflector 3, and a bottom, a side wall and a part of a top end of the post 10 are covered with an interlayer dielectric film 11. An oxide region 12 is formed inside the post 10 by oxidizing a periphery of the AlAs layer 5 for obtaining a higher gain distribution.

Along with increase in data communication capacity in recent years, such a VCSEL is more strongly demanded that can be easily coupled with an optical fiber and is excellent in fast responsiveness. As a VCSEL that is improved in coupling efficiency with an optical fiber, particularly a plastic optical fiber, JP-A-2000-76682 proposes a VCSEL having a columnar semiconductor accumulation body having on an upper surface thereof a laser emission surface with a convex lens form. In JP-A-2000-76682, owing to the use of the VCSEL having a convex lens surface on a semiconductor accumulation body, the divergence angle of the laser beam can be diminished even in the case where the laser output is increased upon making the laser beam incident on a plastic optical fiber having a large propagation loss.

JP-A-2004-63707 proposes such a VCSEL that an aperture diameter d1 corresponding to the aperture 9 of the upper electrode 8 and an aperture diameter d2 defining the current confinement structure (oxide aperture) 12, as shown in FIG. 14, are in a particular range. The use of the structure blocks a higher mode of laser light having a strong electromagnetic field distribution in the circumference of the emission spot among the modes of laser light generated in the current confinement structure, so as to diminish the divergence angle, and thereby the coupling efficiency with an optical fiber is improved.

One of the characteristic features of the VCSEL as compared to an edge emitting laser diode is that the mode in the thickness direction, i.e., the vertical mode, exerts single mode oscillation, whereas the transverse mode is liable to exert a multi-mode oscillation, owing to the small volume of the active layer. It has been known with respect to the transverse mode that in the case where a particular mode is selectively removed, the fluctuation of optical output among the modes becomes unstable to increase the noise upon transmitting data, which is referred to as the mode partition noise, as described in "IEEE Journal of Quantum Electronics", vol. 38, No. 8, pp. 1089-1096.

However, the conventional vertical cavity surface emitting laser diodes have the following problems. The lens surface of the VCSEL disclosed in JP-A-2000-76682 basically has a structure with upward convexity, i.e., the curvature radius on the output aperture side is smaller than the curvature radius on the active region side. In the case where the lens surface has upward convexity, it is difficult in view of the production process that the interlayer dielectric film and the upper electrode metallic film are produced with uniform thickness and sufficient adhesion strength. Accordingly, it is difficult to obtain such a VCSEL that has patterns of the interlayer dielectric film and the upper electrode material formed with excellent reproducibility.

The mode partition noise described in "IEEE Journal of Quantum Electronics", vol. 38, No. 8, pp. 1089-1096 causes disorder in large signal characteristics, particularly eye patterns, and it has been recommended in multi-mode data communication that all the emitted oscillation modes are output. Output of all the oscillation modes from a laser can be attained by such a structure that the aperture diameter d1 defined by the upper electrode is equivalent to or larger than the aperture diameter d2 defined by the current confinement structure, but there is a problem that the divergence angle is increased, and the coupling efficiency with an optical fiber is deteriorated.

It is the current situation that there is no such VCSEL proposed that is excellent in reproducibility and production stability, has a small divergence angle, is excellent in small signal characteristics, and has small mode partition noise.

SUMMARY OF THE INVENTION

The present invention has been made in view of the above circumstances and provides such a vertical cavity surface emitting laser (VCSEL) diode that has a small divergence angle, is excellent in small signal characteristics, has small mode partition noise, and is excellent in production stability, and a process for producing the same.

In the vertical cavity surface emitting laser diode, a lenticular medium having a downward convex surface is inserted between an upper semiconductor reflector and a metallic part functioning as an upper electrode, so as to provide such a VCSEL that is excellent in large signal characteristics of small mode partition noise as well as in small signal characteristic with good production stability and a small divergence angle.

The vertical cavity surface emitting laser diode according to an aspect of the invention contains a lower semiconductor reflector, an active region, an upper semiconductor reflector constituting a resonator with the lower semiconductor reflector, a metallic part being formed on the upper semiconductor reflector, which has a first aperture defining an output region of laser light generated in the active region, and a light confining region being provided between the metallic part and the lower semiconductor reflector, and having a second aperture defining an emission region of the laser light. The upper semiconductor reflector has a lenticular medium having a convex surface toward the lower semiconductor reflector.

BRIEF DESCRIPTION OF THE DRAWINGS

Embodiments of the invention will be described in detail based on the following figures, wherein.

DETAILED DESCRIPTION OF THE INVENTION

The invention will be described in detail below with reference to the following embodiments and the attached figures.

Figure 1A:
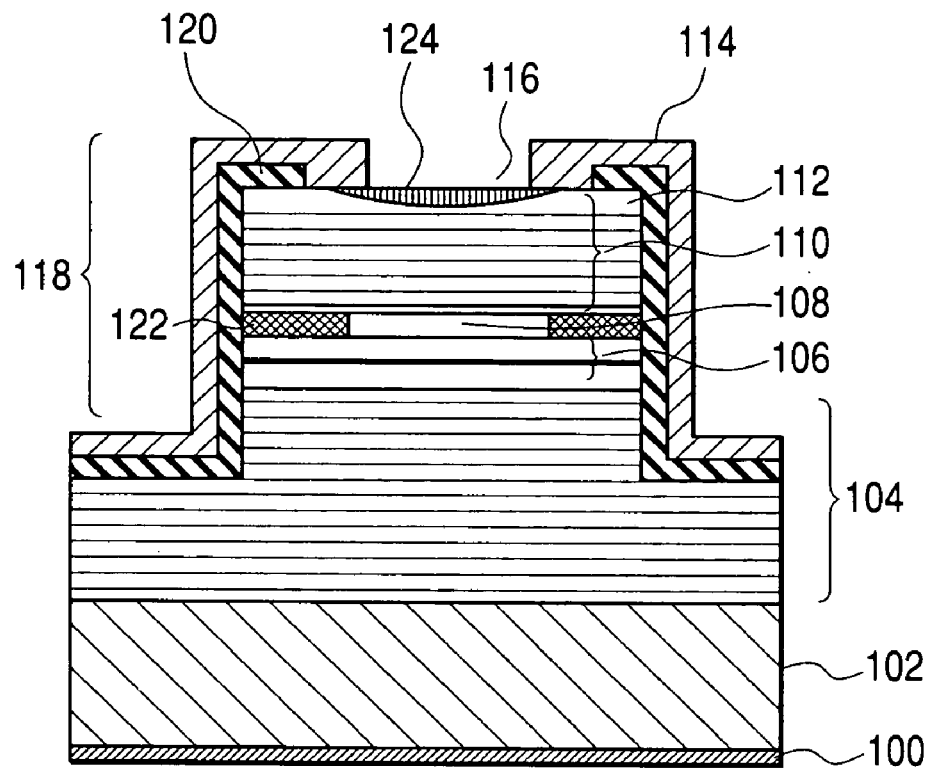
FIG. 1A is a cross sectional view showing a constitution of a VCSEL according to a first embodiment of the invention.
Figure 1B:
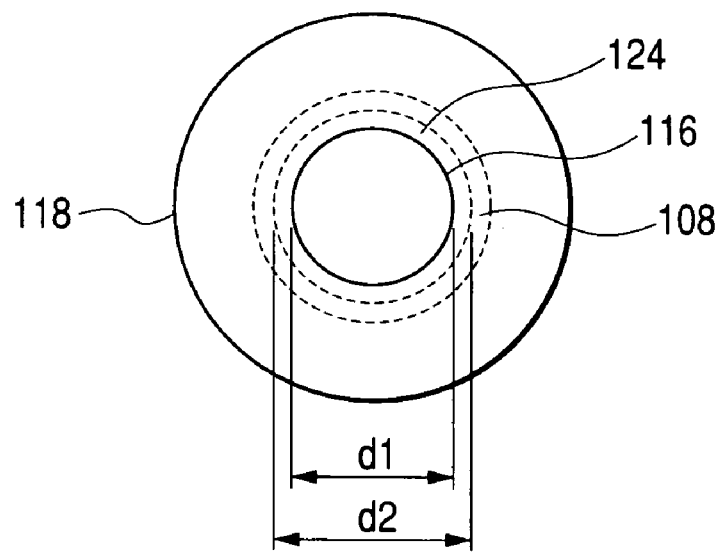
FIG. 1B is a schematic top view showing a VCSEL.

FIG. 1A is a cross sectional view showing a constitution of a VCSEL according to a first embodiment of the invention, and FIG. 1B is a schematic top view showing a VCSEL. As shown in the figures, on a GaAs substrate 102 having an n-side lower electrode 100 formed thereon, semiconductor thin films including an n-type lower semiconductor multi-layer reflector 104, an active region 106, a p-type AlAs layer 108 and a p-type upper semiconductor multi-layer reflector 110 are accumulated in this order. A contact layer 112 formed with p-type GaAs is formed as the upper-most layer of the upper multi-layer reflector 110. A p-side upper electrode 114 is formed on the contact layer 112, and an output aperture 116 having a circular shape is formed at the center of the upper electrode 114. A mesa or post 118 in a cylindrical shape is formed on the substrate up to a part of the lower semiconductor multi-layer reflector 104, and a bottom, a side wall and a part of a top end of the post 118 are covered with an interlayer dielectric film 120. An oxide region 122 is formed on a periphery of the AlAs layer 108 in the post 118 to constitute a light confining region or a current confinement layer.

One of the characteristic features of the VCSEL of this embodiment is as follows. A part of the contact layer 112 of the upper semiconductor multi-layer reflector 110 is removed in a spherical surface form or a curved surface form. A lenticular medium 124 is filled in a region formed by the removal, or the region is covered with the lenticular medium. The boundary surface between the lenticular medium 124 and the contact layer 112 has a convex shape toward the substrate, and the flat surface opposite to the convex surface has the same height as the contact layer 112.

In this embodiment, higher mode light having a strong electromagnetic field distribution in the circumference of the emission spot (i.e., the positions remote from the optical axis) is refracted toward the optical axis at the boundary between the lenticular medium 124 having a convex surface and the contact layer 112 immediately beneath the upper electrode 114. Accordingly, the higher mode light is output from the output aperture 116 without being shielded by the upper electrode 114. Therefore, all the modes oscillated from the active region of the VCSEL are output from the output aperture 116 to obtain such a VCSEL that is suppressed in mode partition noise. Simultaneously, the higher mode thus output is refracted, and thereby the divergence angle is suppressed from being broadened to improve the coupling efficiency with an optical fiber.

In this embodiment, furthermore, the lenticular medium 124 has a downward convex structure, and thereby the interlayer dielectric film 120 and the upper electrode 114 can be formed in a uniform thickness with sufficient adhesion strength and good reproducibility, as compared to the conventional structure having an upward convex lens. More specifically, the post 118 is formed after forming the lenticular medium 124, and then the interlayer dielectric film 120 and the upper electrode 114 are patterned. At this time, the process steps including coating of the material, photolithography and etching are effected on the flat surface on the top of the post, and thus the steps can be effected with good controllability and reproducibility to form a pattern with high accuracy.

Examples of the material constituting the lenticular medium include a dielectric film, such as $SiO_2$, $TiO_2$, $Al_2O_3$, MgO, $Ta_2O_5$, $MgF_2$, $HfO_2$ and $ZrO_2$, and a nitride film or a transparent electroconductive film, such as SiN, SiON, $SiN_x$, $SiN_xO_y$, TiN and ITO, and in particular, a silicon nitride film, such as SiN, SiON, $SiN_x$ and $SiN_xO_y$, is preferred since the stress applied to the VCSEL can be suppressed minimally.

The range of the curvature radius r of the lenticular medium 124 is preferably from 5 to 2,000 μm, and more preferably from 100 to 1,000 μm, since the higher modes can be efficiently refracted, and good process controllability can be obtained in the range. In the case where the curvature radius r is less than 5 μm, it is not preferred since the upper semiconductor multi-layer reflector may be damaged upon processing.

It is preferred that the lenticular medium 124 is formed inside the contact layer 120, i.e., immediately beneath the diameter d1 of the aperture defining the output aperture 116 of the upper electrode 114, and the diameter d1 is smaller than the diameter d2 of the aperture of the oxide aperture (AlAs layer 108) surrounded by the oxide region 122. In the case where the diameter d1 is smaller than the diameter d2, such a VCSEL can be obtained that has a small divergence angle and excellent modulation characteristics at a low temperature. It is considered that the good modulation characteristics are obtained at a low temperature because the electrode partly overlaps the active layer region, and thereby the carriers maldistributed in the peripheral part of the active layer at a low temperature are facilitated to migrate to the central part of the active layer. However, such a structure is preferred that the higher modes refracted by the lenticular medium are not shielded by the upper electrode 114.

In the case where the aperture (output aperture 116) of the upper electrode 114 has a circular shape, the diameter d1 of the aperture means a diameter of the circular shape. In the case where the aperture has an elliptic shape, the diameter d1 means an average value of the major diameter and the minor diameter of the elliptic shape, and in the case where the aperture has a rectangular shape, the diameter d1 means an average value of the lengths of the diagonal lines of the rectangular shape. The diameter d2 of the oxide aperture is also defined in the same manner. The shape of the lenticular medium 124 is preferably such a shape that corresponds to the shape of the output aperture 116, and in the case where the output aperture 116 has a circular shape, it is preferred that the shape of the lenticular medium 124 is a circular shape.

The diameter d1 of the output aperture 116 is preferably from 5 to 30 µm. In the case where the diameter d1 is smaller than the diameter d2 of the oxide aperture, there is such a tendency that the carriers are uniformly distributed over the entire active layer, and in particular, the divergence angle can be suppressed from being broadened at a low temperature. Therefore, the diameter d2 of the oxide aperture is preferably from 5 to 20 µm, and more preferably from 7 to 15 µm. In the case where the diameter d2 is less than 5 µm, the static withstand voltage of the VCSEL is lowered, and in the case where it exceeds 20 µm, there is such a tendency that the fast responsiveness is lowered.

The current confinement structure may be appropriately selected from the known procedures including an implanted VCSEL, in which hydrogen ions are irradiated onto the surface to lower the electroconductivity in part, and an oxide VCSEL, in which the AlAs layer 108 is oxidized from the outside to form a dielectric layer. It is preferred to provide a current confinement structure containing a high resistance region formed by oxidation having excellent fast responsiveness characteristics, whereby no kink appears in the current-optical output characteristics with less power consumption.

Figure 2:
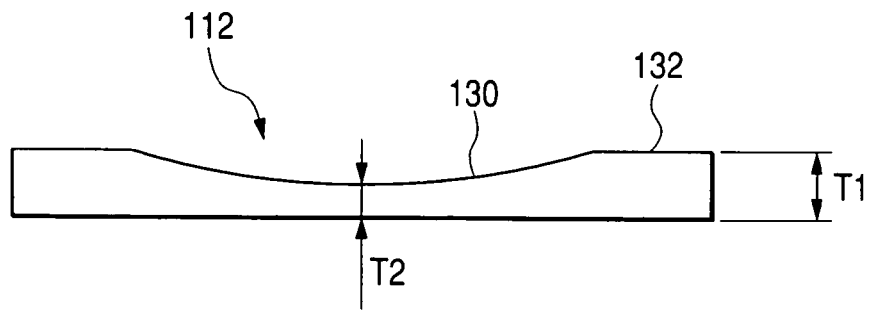
FIG. 2 is a diagram showing a film thickness of a contact layer.

The thickness of the contact layer 112 having a contact surface with the lenticular medium 124 will be described with reference to FIG. 2. The contact layer 112 has a recession 130 formed by removing a part of the surface thereof in a curved surface form or a spherical surface form, and a flat upper surface 132 not removed. The thickness of the contact layer 112 at the flat surface 132 is denoted by T1, and the thickness at the center of the contact layer 112 is denoted by T2. The thickness T1 is the maximum thickness of the contact layer 112, and is preferably from 50 to 500 nm, and more preferably from 100 to 300 nm. In the case where the maximum thickness T1 exceeds 500 nm, the higher modes are not output due to absorption by the contact layer 112, and in the case where it is less than 50 nm, the higher modes are not sufficiently refracted at the boundary surface with the lenticular medium 124 to impair the effects of reducing the divergence angle and decreasing the mode partition noise.

It is particularly preferred that when the total thickness of the thickness T1 of the contact layer 112 and the uppermost layer of the upper semiconductor multi-layer reflector 110 immediately beneath the contact layer 112 is substantially identical to odd number times $\lambda/(4n_{eff})$, laser oscillation can be obtained without impairing the function as a resonator. Herein, $\lambda$ represents the oscillation wavelength, and $n_{eff}$ represents the effective refractive index determined by the thicknesses and the refractive indexes of the contact layer and the uppermost layer of the upper semiconductor multi-layer reflector.

The thickness T2 of the contact layer 112 at its center is the minimum thickness. The thickness T2 is preferably 50 nm or less, and more preferably 20 nm or less. In the case where the minimum thickness exceeds 50 nm, the lower modes are absorbed to make the optical output insufficient. The thickness T2 includes such a state that the contact layer 112 is completely etched out, i.e., zero.

Figure 3A:
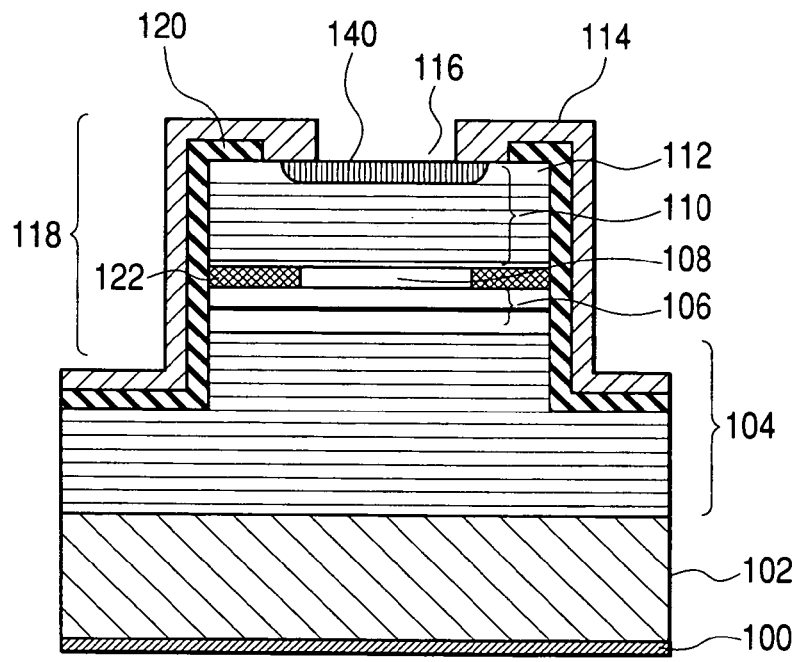
FIG. 3A is a cross sectional view showing a constitution of a VCSEL according to a second embodiment of the invention.
Figure 3B:
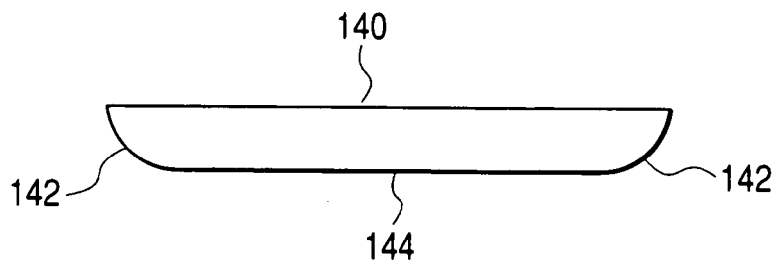
FIG. 3B is a schematic enlarged cross sectional view showing a lenticular medium.

A second embodiment of the invention will be described. FIG. 3A is a cross sectional view showing a constitution of a VCSEL according to the second embodiment, and FIG. 3B is a schematic enlarged cross sectional view showing a lenticular medium. The difference from the VCSEL of the first embodiment resides in the shape of the lenticular medium, and in other word, resides in the shape of the recession of the contact layer 112. The lenticular medium 140 has a convex surface toward the substrate, and the convex surface has a curved surface only in a peripheral part 142 in the circumferential direction of the lenticular medium 140, and has a flat surface in a region 144 other than the peripheral part 142. In this case, the thickness T1, T2 of the contact layer 112 follows the preferred conditions shown in FIG. 2, but the thickness T2 in the recession 130 of the contact layer 112 may be a certain thickness or may be zero to expose the underlayer.

The lenticular medium 140 of the second embodiment can refract, as similar to the first embodiment, the higher mode light generated at positions remote from the optical axis by the curved surface in the peripheral part 142 of the lenticular medium toward the optical axis, so as to output from the output aperture 116, whereby all the modes of the multi-mode oscillation can be output, and the divergence angle can be suppressed from being broadened.

Figure 4:
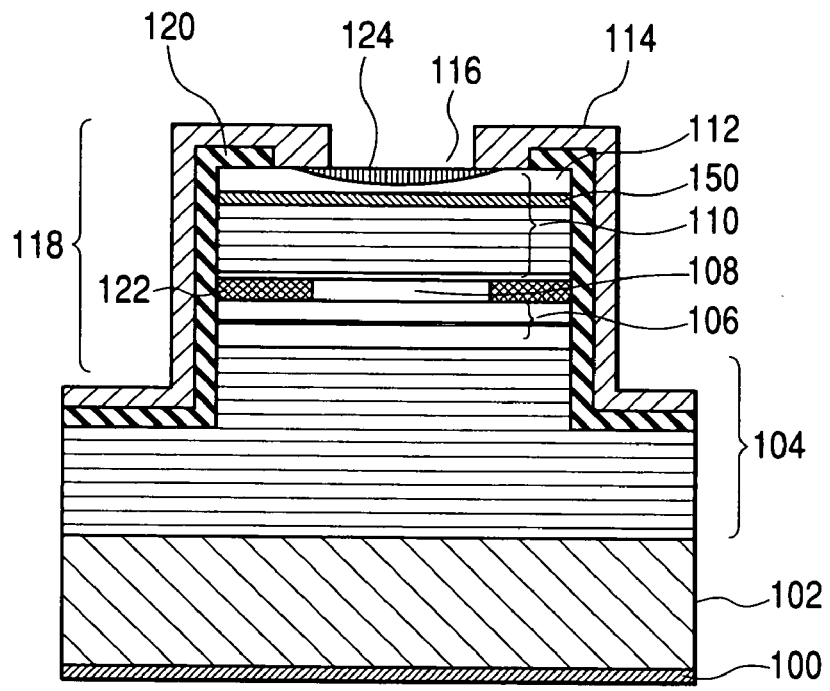
FIG. 4 is a cross sectional view showing a constitution of a VCSEL according to a third embodiment of the invention.

FIG. 4 is a cross sectional view showing a constitution of a VCSEL according to a third embodiment of the invention. The VCSEL of the third embodiment has the same constitution as the VCSEL of the first embodiment except for an etching stop layer 150 intervening immediately beneath the contact layer 112. Upon forming the lenticular medium 124, a recession 130 (shown in FIG. 2) is formed on a part of the surface of the contact layer 112. At this time, while the thickness T2 at the center of the contact layer 112 may be zero, the etching is difficult to be effected with high accuracy, and the presence of the etching stop layer 150 prevents the semiconductor multi-layer reflector as the underlayer from being damaged due to overetching. The material for the etching stop layer 150 may be those having a good etching selective ratio with respect to the contact layer 112.

The etching stop layer may be provided not only in the VCSEL of the first embodiment, but also in the VCSEL of the second embodiment.

Figure 5:
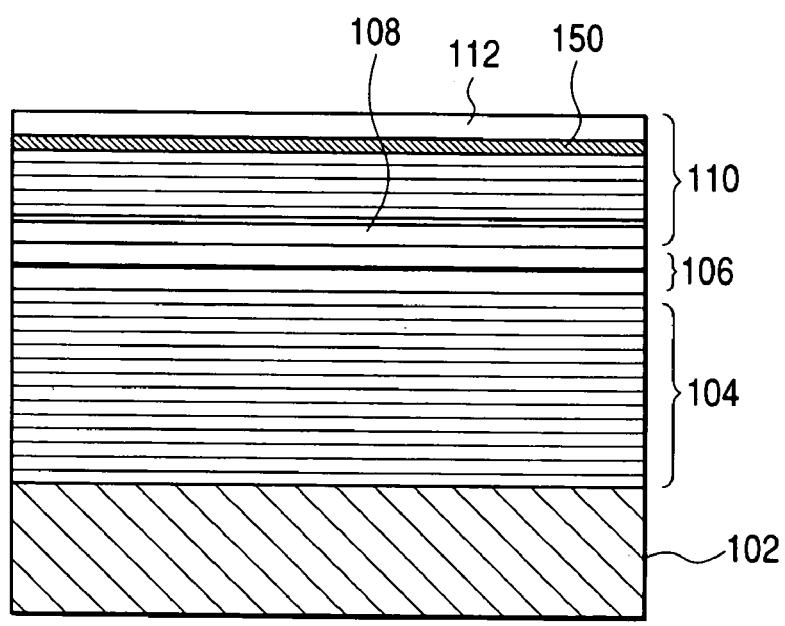
FIG. 5 is a schematic cross sectional view showing a production process of a VCSEL according to a fourth embodiment of the invention.

A fourth embodiment of the invention will be described with reference to FIGS. 5, 6A, 6B, 6C and 7 to 12. The fourth embodiment relates to a process for producing the aforementioned VCSEL of the third embodiment. As shown in FIG. 5, on a (100) plane of an n-type GaAs substrate 102, based on MOCVD (metalorganic chemical vapor deposition process) a lower semiconductor multi-layer reflector 104 formed by accumulating plural layers of n-type $Al_{0.8}Ga_{0.2}As$ layers and n-type $Al_{0.1}Ga_{0.9}As$ layers; an active region 106 formed by accumulating a spacer layer formed with an undoped $Al_{0.4}Ga_{0.6}As$ layer, a barrier layer formed with an undoped $Al_{0.2}Ga_{0.8}As$ layer and a quantum well layer formed with an undoped GaAs layer; an upper multi-layer reflector 110 formed by accumulating plural layers of a p-type AlAs layer 108, p-type $Al_{0.8}Ga_{0.2}As$ layers and p-type $Al_{0.1}Ga_{0.9}As$ layers; an etching stop layer 150 formed with GaInP; and a contact layer 112 formed with a p-type GaAs layer are accumulated in this order.

The lower semiconductor multi-layer reflector 104 is formed with an accumulation body of plural layers including n-type $Al_{0.8}Ga_{0.2}As$ layers and n-type $Al_{0.1}Ga_{0.9}As$ layers. The thicknesses of the respective layers correspond to $\lambda/4n_r$, (wherein $\lambda$ represents an oscillation wavelength, and $n_r$ represents an optical refractive index within the medium), and the layers different in mixed crystal ratio are alternately accumulated in 36.5 cycles. The carrier concentration after doping with silicon as an n-type impurity is $3\times10^{18}$ cm$^{-3}$.

The active region 106 is formed with an accumulation body of quantum well active layers each having a thickness of 8 nm formed with an undoped GaAs layer and barrier layers each having a thickness of 5 nm formed with an undoped $Al_{0.2}Ga_{0.8}As$ layer accumulated alternately (provided that the outer layers are the barrier layers), which is disposed at the central position of the spacer layer formed with an undoped $Al_{0.4}Ga_{0.6}As$ layer, and is designed in such a manner that the thickness of the spacer layer including the quantum well active layers and the barrier layers is an integral multiple of $\lambda/4n_r$. Radiation light having a wavelength of 850 nm is obtained by the active region 106 having the aforementioned constitution.

The upper semiconductor multi-layer reflector 110 is formed with an accumulation body of plural layers including p-type $Al_{0.8}Ga_{0.2}As$ layers and p-type $Al_{0.1}Ga_{0.9}As$ layers. The thicknesses of the respective layers correspond to $\lambda/4n_r$, as similar to the lower semiconductor multi-layer reflector 104, and the layers different in mixed crystal ratio are alternately accumulated in 22 cycles. The number of cycles is the total number including the AlAs layer 108 provided on the lower layer and the contact layer 112 provided on the upper layer. The AlAs layer 108 may not have such a constitution that the material constituting the thickness of $\lambda/4n_r$ is entirely formed with AlAs, but contrary, the AlAs layer 108 having too large a thickness may bring about a problem of increased optical scattering loss. Accordingly, in this case, the AlAs layer 108 has a thickness of 30 nm, and the remaining part is $Al_{0.9}Ga_{0.1}As$. The carrier concentration after doping with carbon as a p-type impurity is $3\times10^{18}$ cm$^{-3}$.

The etching stop layer 150 formed with GaInP has such a function that the upper multi-layer reflector as an underlayer is prevented from being damaged due to overetching upon dry etching. The contact layer 112 formed with a p-type GaAs layer has a thickness of 200 nm and a carrier concentration after doping with zinc as a p-type impurity of $1\times10^{19}$ cm$^{-3}$.

Subsequently, the laser substrate containing the semiconductor substrate 102 having accumulated thereon the lower semiconductor multi-layer reflector 104, the active region 106, and the upper semiconductor multi-layer reflector 110 including the AlAs layer 108, the etching stop layer 150 and the contact layer 112 is taken out from the growing chamber, and a pattern in a curved surface form is formed thereon by using a mask of a resist.

Figure 6A:
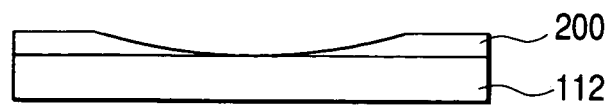
FIGS. 6A to 6C are schematic cross sectional views showing a production process of a VCSEL according to a fourth embodiment of the invention.
Figure 6B:
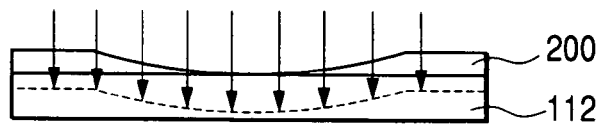
Figure 6C:

As shown in FIG. 6A, a mask pattern 200, such as a resist, having a recession in a curved surface form is formed on the contact layer 112 as the uppermost layer of the upper semiconductor multi-layer reflector 110, and then as shown in FIG. 6B, the mask pattern 200 and the contact layer 112 are dry-etched in such a manner that the shape of the mask pattern 200 is directly transferred to the contact layer 112 as an underlayer. The mask pattern 200 is then removed to form the contact layer 112 having a recession 130 having a spherical surface form or a curved surface form, as shown in FIG. 6C.

In the case where the mask pattern having a recession in a concave surface form is formed, for example, by using a positive resist as the mask, the exposure energy is set at a relatively low level, and development is effected until just before the resist in the exposed part is completely lost. Alternatively, the resist may be exposed through a gray scale mask (mask having different optical transmittances) having a density of dots or a density of silver atoms controlled locally, so as to form a mask pattern having an inclination in a curved surface form at the central part thereof.

Figure 7:
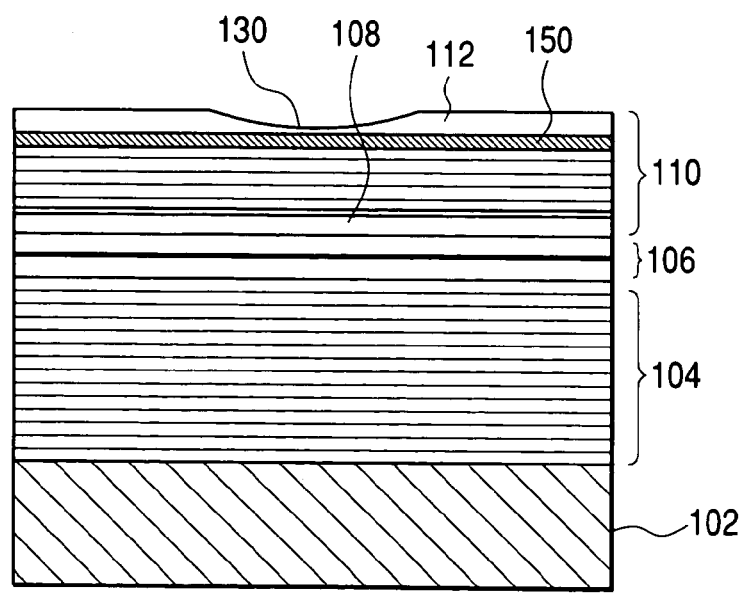
FIG. 7 is a schematic cross sectional view showing a production process of a VCSEL according to a fourth embodiment of the invention.
Figure 8:
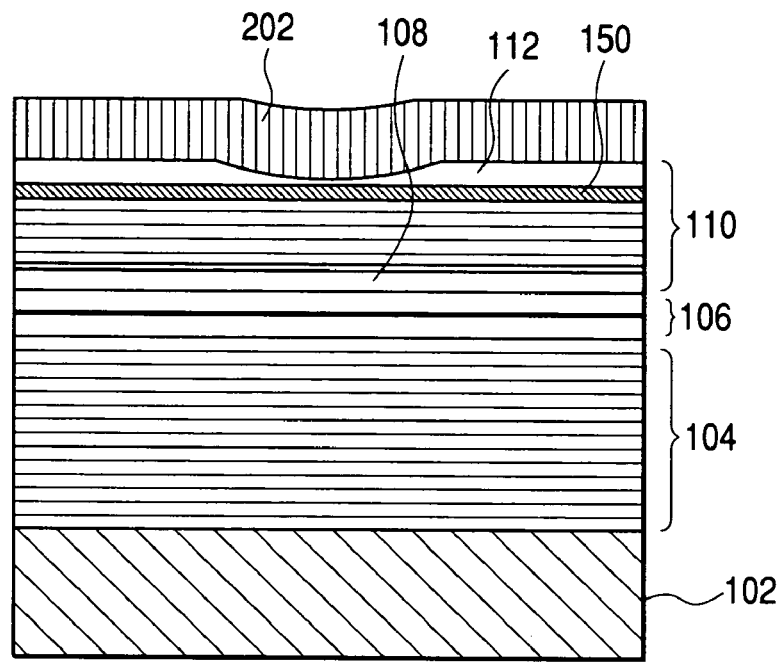
FIG. 8 is a schematic cross sectional view showing a production process of a VCSEL according to a fourth embodiment of the invention.

The recession 130 is thus formed on the surface of the semiconductor accumulation body, as shown in FIG. 7. As shown in FIG. 8, a nitride film 202 formed with SiN or the like is then formed in a prescribed thickness on the contact layer 112 including the recession 130. The nitride film 202 has such a thickness that sufficiently covers the recession 130.

Figure 9:
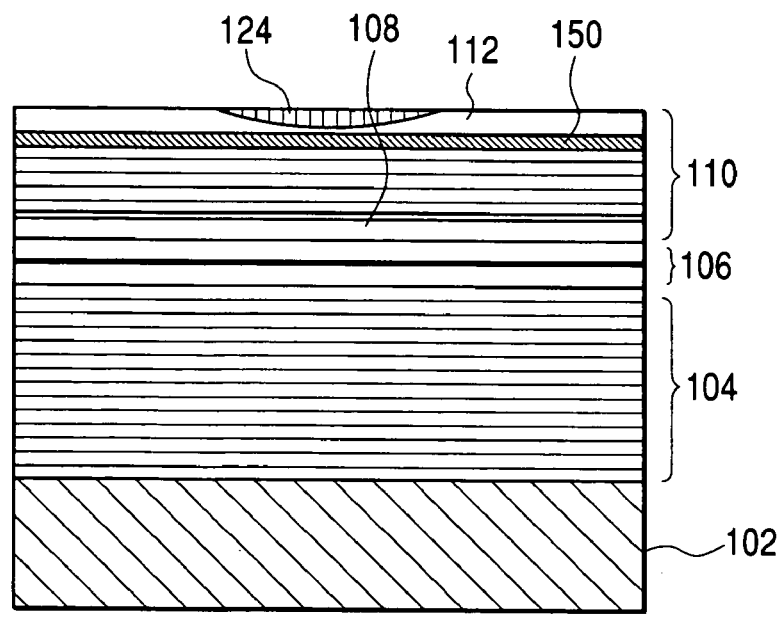
FIG. 9 is a schematic cross sectional view showing a production process of a VCSEL according to a fourth embodiment of the invention.

Subsequently, as shown in FIG. 9, the nitride film 202 and the contact layer 112 are partially removed through flattening processing of CMP (chemical mechanical polishing) to make the nitride film 202 remain in the recession 130 of the contact layer 112. The upper surface of the contact layer 112 forms a flat plane having formed on a part of the surface thereof a lenticular medium 124 having a convex surface toward the substrate.

Figure 10:
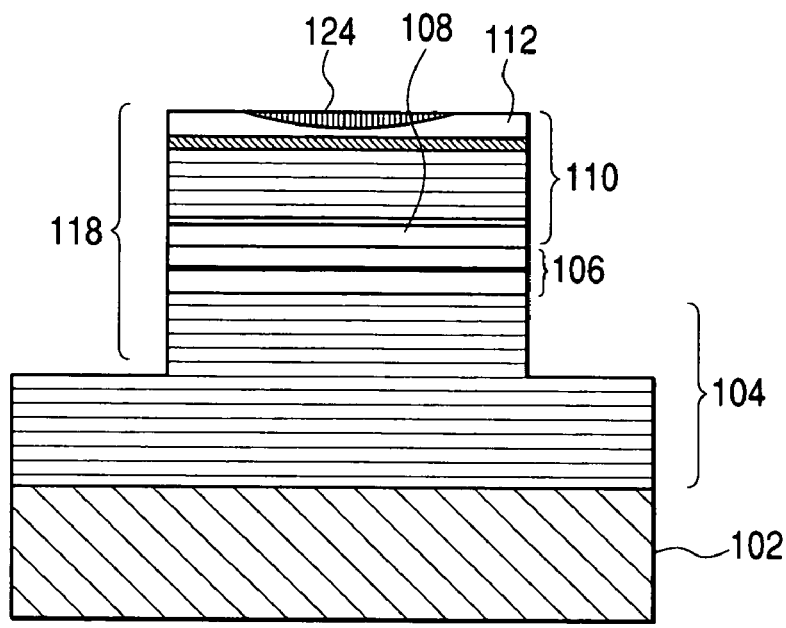
FIG. 10 is a schematic cross sectional view showing a production process of a VCSEL according to a fourth embodiment of the invention.

Thereafter, the substrate is processed by photolithography and anisotropic etching to form a cylindrical post 118 shown in FIG. 10. The depth of etching reaches a part of the active region 106 because the AlAs layer 108 is oxidized from the side surface of the post in an oxidizing step in the later stage. In other words, it is sufficient in the case of an oxide VCSEL that at least the AlAs layer 108 is exposed from the side surface of the post, and the depth of etching may reach a part of the lower semiconductor multi-layer reflector 104 beyond the active region 106.

Figure 11:
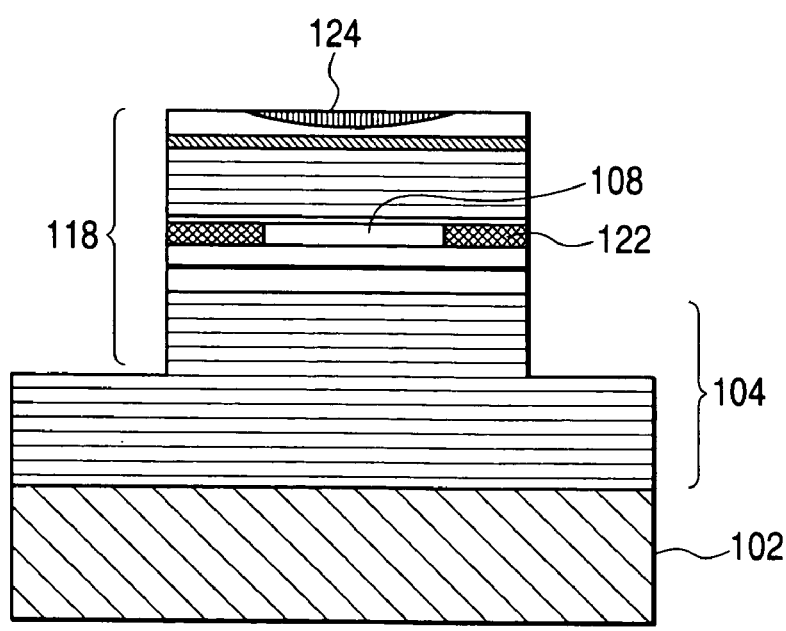
FIG. 11 is a schematic cross sectional view showing a production process of a VCSEL according to a fourth embodiment of the invention.

After forming the post 118 on the substrate, the semiconductor substrate is exposed, as shown in FIG. 11, to a water vapor atmosphere at 340° C. with a carrier gas containing nitrogen (flow rate: 2 L/min) for 40 minutes to effect an oxidizing treatment. The AlAs layer 108 constituting a part of the upper multi-layer reflector 110 exerts an oxidizing rate that is considerably higher than those of the $Al_{0.8}Ga_{0.2}As$ layer and the $Al_{0.1}Ga_{0.9}As$ layer similarly constituting a part thereof. Accordingly, an oxide region 122 in a circular shape reflecting the shape of the post is formed immediately on the active region 106 as a part inside the post, and the unoxidized region (oxide aperture) left without being oxidized forms a current injection region or an electroconductive region. The oxide region 122 forms the current confinement part and simultaneously functions as a light confining region since the optical refractive index thereof is about a half of that of the surrounding semiconductor layer.

Figure 12:
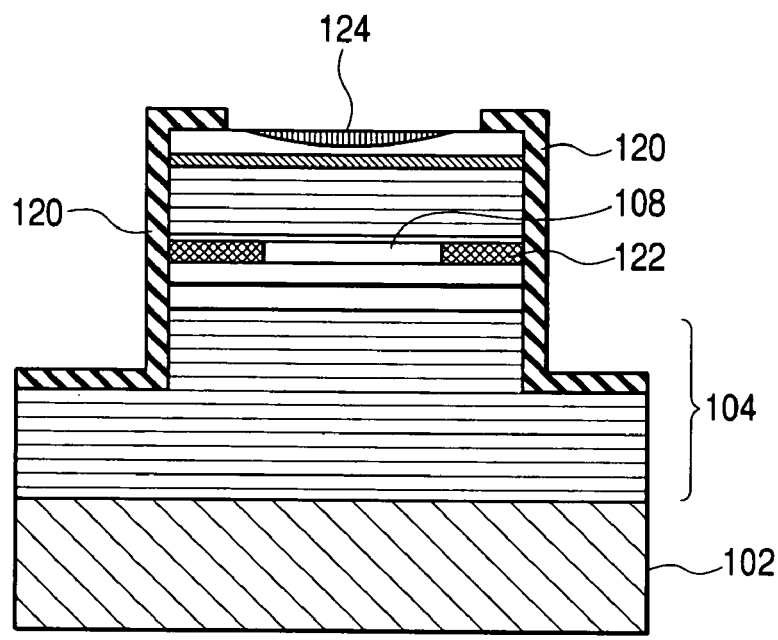
FIG. 12 is a schematic cross sectional view showing a production process of a VCSEL according to a fourth embodiment of the invention.

Thereafter, a dielectric film formed with a silicon oxide or the like is formed on the upper surface of the substrate including the exposed side surface of the post, and the dielectric film is partially removed by patterning to expose the contact layer 112 on a part of the top of the post, so as to form the interlayer dielectric film 120 as shown in FIG. 12. At this time, the interlayer dielectric film 120 can have a uniform thickness and can exert high adhesion strength owing to the flat surface on the top of the post.

Subsequently, as shown in FIG. 4, a p-type upper electrode 114 is formed on the top of the post to make electric contact with the contact layer 122. The upper electrode 114 is patterned to form a circular aperture, i.e., the output aperture 116, at the central part thereof. Finally, an n-side electrode 100 is formed on the back surface of the substrate 102 to complete the VCSEL of the third embodiment.

A fifth embodiment of the invention will be described. The fifth embodiment relates to a process for producing the VCSEL of the second embodiment. As similar to the case of the fourth embodiment, a lower semiconductor multi-layer reflector 104, an active region 106, an AlAs layer 108, an upper semiconductor multi-layer reflector 110, an etching stop layer 152 and a contact layer 112 are accumulated on a semiconductor substrate 102. In the fifth embodiment, the etching stop layer 152 is formed with AlAs as being different from the fourth embodiment.

Figure 13:
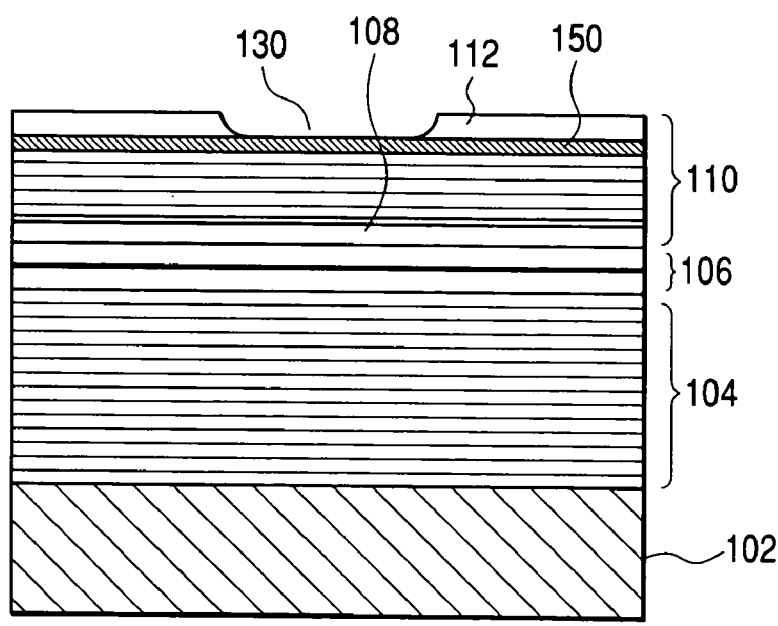
FIG. 13 is a schematic cross sectional view showing a production process of a VCSEL according to a fifth embodiment of the invention.
Figure 14:
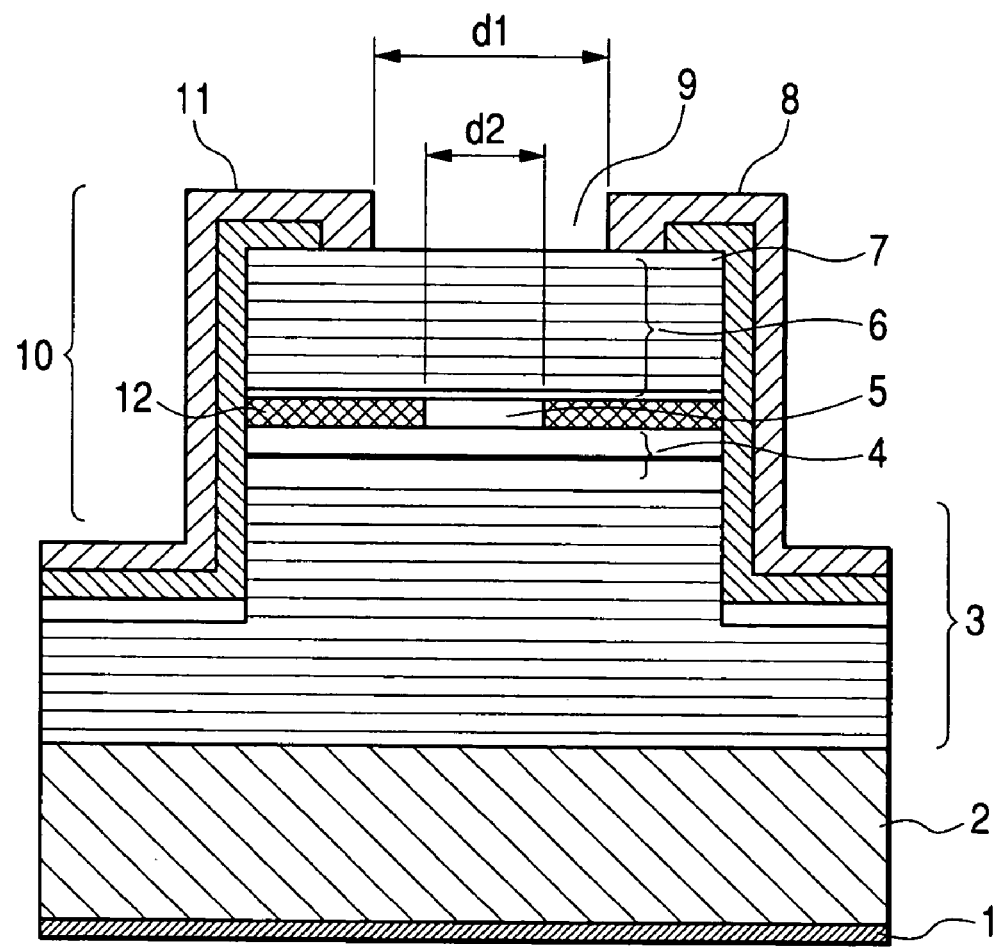
FIG. 14 is a cross sectional view showing a constitution of a conventional VCSEL.

The substrate having the plural semiconductor layers formed thereon is taken out from the growing chamber, and a mask pattern is formed on the contact layer 112 by using a mask of a resist or the like. The contact layer 112 is then subjected to isotropic wet etching by using an etchant, such as sulfuric acid, to form a recession pattern having a curved surface only on the peripheral part of the contact layer, as shown in FIG. 13. The thickness T2 on the central part of the contact layer 112 is preferably 50 nm or less, and may be zero, i.e., the contact layer 112 may be completely removed. The underlayer of the contact layer 112 is prevented from being damaged by etching owing to the presence of the etching stop layer 152, beneath the contact layer 112, formed with AlAs having a selective ratio different from the GaAs layer.

The subsequent process steps are carried out in the same manner as in the fourth embodiment, and a VCSEL equipped with a lenticular medium having a curved surface only on the peripheral part can be finally obtained.

While the fifth embodiment exemplifies wet etching for forming the recession pattern on the contact layer 112, the recession pattern may be formed by isotropic dry etching. The material for the etching stop layer is preferably AlAs in the case where wet etching is employed, and is preferably GaInP in the case where dry etching is employed, but is not limited to these materials as far as a proper selective ratio is obtained with respect to the contact layer 112.

According to the embodiments of the invention, as having been described, such a VCSEL can be reproduced that has a uniform thickness and good production stability because the top surface of the post is basically flat upon forming the interlayer dielectric film 120 and the upper electrode 114 on the contact layer 112.

While the embodiments of the invention use GaAs as a material for forming a quantum well layer, the materials used in the invention are not limited thereto, and for example, semiconductor materials belonging to Groups 3 to 5, such as AlGaAs, InGaAs and GaInNAs, can be used. Furthermore, the MOCVD process is used as the crystal growing process, but the invention is not limited to the process while accumulation of the semiconductor layers may be effected by other processes. For example, a molecular beam epitaxy (MBE) process may be used.

While CMP is exemplified as the flattening process of the lenticular medium, another flattening process may be effected by a known etchback method.

The aforementioned embodiments are provided for only exemplification, and the scope of the invention is not construed as being limited thereto. The invention may be practiced based on other embodiments that satisfy the constitutional elements of the invention.

The vertical cavity surface emitting laser diode according to the invention may be arranged solely or in the form of a two-dimensional array, on a substrate, and can be utilized as a light source for optical communication, optical recording and the like.

As described above, a vertical cavity surface emitting laser diode according to an aspect of the present invention includes a lower semiconductor reflector, an active region, an upper semiconductor reflector constituting a resonator with the lower semiconductor reflector, a metallic part being formed on the upper semiconductor reflector, which has a first aperture defining an output region of laser light generated in the active region, and a light confining region being provided between the metallic part and the lower semiconductor reflector, and having a second aperture defining an emission region of the laser light. The upper semiconductor reflector includes a lenticular medium having a convex surface toward the lower semiconductor reflector.

The upper semiconductor reflector may have a contact layer in contact with the metallic part, and the lenticular medium may be formed in a part of the contact layer.

The lenticular medium may have a flat surface opposite to the convex surface. The flat surface of the lenticular medium may have substantially the same height as an upper surface of the contact layer.

The convex surface of the lenticular medium may be a spherical surface. The lenticular medium may have a curvature radius of from 5 to 2,000 μm.

The convex surface referred herein may not be necessarily spherical over the entire surface, and may contain a spherical surface or a curved surface only partly, for example, in only a periphery (edge) thereof. For example, the convex surface may be a substantially spherical surface or a non-spherical surface. The planar shape of the convex surface may be such a shape that corresponds to the first aperture. In the case where the first aperture has a circular shape, for example, the planar shape of the convex surface may be a circular shape.

The contact layer has a thickness of from 50 to 500 nm at a part not in contact with the lenticular medium, and a thickness of 50 nm or less at a part in contact with the lenticular medium.

The convex surface may have a diameter that is larger than diameters of the first and second apertures, and the first aperture may have a diameter that is smaller than a diameter of the second aperture. In the case where the diameter of the first aperture is smaller than the diameter of the second aperture, the divergence angle of the laser light can be diminished, and the multi-mode oscillation may be facilitated. In the case where the diameter of the convex surface is smaller than the diameter of the first aperture, light with higher modes remote from the optical axis can be output from the first aperture without shielding by the metallic part. In the case where the planar shape of the aperture is a circular shape, the diameter of the aperture referred herein means a diameter of the circular shape, and in the case where the planar shape of the aperture is an elliptic shape, it means an average value of the major diameter and the minor diameter of the elliptic shape. In the case where the planar shape of the aperture is a rectangular shape, the diameter of the aperture means an average value of the lengths of the diagonal lines of the rectangular shape. The diameter of the convex surface herein may also be defined in the same manner.

The lenticular medium may be made of at least one of a dielectric film, a nitride film and a transparent electroconductive film.

The lenticular medium contains one of $SiO_2$, $TiO_2$, $Al_2O_3$, MgO, $Ta_2O_5$, $MgF_2$, $HfO_2$, $ZrO_2$, SiN, SiON, TiN and ITO.

The contact layer may contain GaAs, and the vertical cavity surface emitting laser diode may further contain one of an AlAs layer and a GaInP layer immediately beneath the contact layer.

The vertical cavity surface emitting laser diode may exert multi-mode oscillation.

The light confining region may have a high resistance region formed by oxidizing Al, and an electroconductive region surrounded by the high resistance region.

According to another aspect of the present invention, a process for producing a vertical cavity surface emitting laser diode includes forming, on a substrate, a semiconductor accumulation body having plural semiconductor layers containing at least a lower multi-layer reflecting film, an active region and an upper multi-layer reflecting film, forming, on the semiconductor accumulation body, a mask pattern having a recession having a concave surface, etching the semiconductor accumulation body by using the mask pattern to form, on a surface of the semiconductor accumulation body, a recession having a concave surface reflecting a shape of the mask pattern, coating a layer for forming a lenticular medium on a region containing the recession having a concave surface of the semiconductor accumulation body, and removing a part of the lenticular medium to make the lenticular medium remain at least in the recession having a concave surface of the semiconductor accumulation body.

The lenticular medium may be made of at least one of a dielectric film, a nitride film and a transparent electroconductive film.

The mask pattern may include a positive resist, and upon exposing the resist, exposure energy may be made smaller in a peripheral part than in a central part to form the recession having a concave surface.

Alternatively, the mask pattern may include a resist, and the resist may be exposed by using a gray scale mask having different transmittances to form the recession having a concave surface.

The step of forming the recession having a concave surface on the surface of the semiconductor accumulation body may include a step of dry etching a resist pattern and the semiconductor accumulation body simultaneously.

The step of removing a part of the lenticular medium may include a flattening process by chemical mechanical polish or by etchback.

The semiconductor accumulation body may contain an etching stop layer immediately beneath the layer having formed thereon the recession having a concave surface.

The process for producing a vertical cavity surface emitting laser diode may further include etching the semiconductor accumulation body to form a post on the substrate, and oxidizing at least a layer containing Al in the post to form a current confinement layer.

According to another aspect of the present invention, a process for producing a vertical cavity surface emitting laser diode includes forming, on a substrate, a semiconductor accumulation body having plural semiconductor layers containing at least a lower multi-layer reflecting film, an active region and an upper multi-layer reflecting film, forming, on the semiconductor accumulation body, a mask pattern, isotropically etching a part of the semiconductor accumulation body by using the mask pattern to form a recession having a curved surface on a peripheral part, coating a lenticular medium on a region including the recession of the semiconductor accumulation body, and removing a part of the lenticular medium to make the lenticular medium remain at least in the recession of the semiconductor accumulation body.

According to the above-described vertical cavity surface emitting laser diode, the lenticular medium with a convex surface having a smaller curvature radius on the active region side on the electrode side than the curvature radius is inserted between the upper semiconductor reflector and the metallic part, whereby laser light of higher modes remote from the optical axis is refracted toward the optical axis to diminish the divergence angle. Accordingly, such a VCSEL can be provided that is improved in coupling efficiency with an optical fiber and is excellent not only in small signal characteristics but also in large signal characteristics with small mode partition noise. Furthermore, the lenticular medium has a convex surface toward the lower semiconductor reflector, and thus the interlayer dielectric film and the metallic part can be uniformly produced with sufficient adhesion strength and good reproducibility, as compared to a lenticular medium having an upward convex surface, whereby the production stability can be improved.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

The entire disclosure of Japanese Patent Application No. 2004-191855 filed on Jun. 29, 2004 including specification, claims, drawings and abstract is incorporated herein by reference in its entirety.

What is claimed is:

1. A vertical cavity surface emitting laser diode comprising:
   a lower semiconductor reflector;
   an active region;
   an upper semiconductor reflector constituting a resonator with the lower semiconductor reflector;
   a metallic part being formed on the upper semiconductor reflector, and having a first aperture defining an output region of laser light generated in the active region; and
   a light confining region being provided between the metallic part and the lower semiconductor reflector, and having a second aperture defining an emission region of the laser light,
   wherein the upper semiconductor reflector has a contact layer in contact with the metallic part and a lenticular medium formed in a part of the contact layer, the lenticular medium having a convex surface toward the lower semiconductor reflector,
   wherein the contact layer has a thickness of from 50 to 500 nm at a part not in contact with the lenticular medium, and a thickness of 50 nm or less at a part in contact with the lenticular medium.

2. The vertical cavity surface emitting laser diode as claimed in claim 1, wherein the upper semiconductor reflector includes a lenticular medium having a curved surface on a peripheral part thereof.

3. The vertical cavity surface emitting laser diode as claimed in claim 1, wherein the lenticular medium has a flat surface opposite to the convex surface.

4. The vertical cavity surface emitting laser diode as claimed in claim 1, wherein a flat surface of the lenticular medium has substantially the same height as an upper surface of the contact layer.

5. The vertical cavity surface emitting laser diode as claimed in claim 1, wherein the convex surface of the lenticular medium is a spherical surface.

6. The vertical cavity surface emitting laser diode as claimed in claim 5, wherein the lenticular medium has a curvature radius of from 5 to 2,000 μm.

7. The vertical cavity surface emitting laser diode as claimed in claim 1, wherein the convex surface of the lenticular medium has a curved surface only in a peripheral part.

8. The vertical cavity surface emitting laser diode as claimed in claim 1, wherein the convex surface has a diameter that is larger than diameters of the first and second apertures.

9. The vertical cavity surface emitting laser diode as claimed in claim 1, wherein the first aperture has a diameter that is smaller than a diameter of the second aperture.

10. The vertical cavity surface emitting laser diode as claimed in claim 1, wherein the lenticular medium comprises at least one of a dielectric film, a nitride film and a transparent electroconductive film.

11. The vertical cavity surface emitting laser diode as claimed in claim 10, wherein the lenticular medium comprises one of $SiO_2$, $TiO_2$, $Al_2O_3$, MgO, $Ta_2O_5$, $MgF_2$, $HfO_2$, $ZrO_2$, SiN, SiON, TiN and ITO.

12. The vertical cavity surface emitting laser diode as claimed in claim 1, wherein the contact layer comprises GaAs, and the vertical cavity surface emitting laser diode further comprises one of an AlAs layer and a GaInP layer immediately beneath the contact layer.

13. The vertical cavity surface emitting laser diode as claimed in claim 1, wherein the vertical cavity surface emitting laser diode exerts multi-mode oscillation.

14. The vertical cavity surface emitting laser diode as claimed in claim 1, wherein the light confining region comprises a high resistance region formed by oxidizing Al, and an electroconductive region surrounded by the high resistance region.

15. A vertical cavity surface emitting laser diode comprising:
   a lower semiconductor reflector;
   an active region;
   an upper semiconductor reflector constituting a resonator with the lower semiconductor reflector;
   a metallic part being formed on the upper semiconductor reflector, and having a first aperture defining an output region of laser light generated in the active region; and
   a light confining region being provided between the metallic part and the lower semiconductor reflector, and having a second aperture defining an emission region of the laser light,
   wherein the upper semiconductor reflector includes a lenticular medium having a convex surface toward the lower semiconductor reflector, the upper semiconductor reflector has a contact layer in contact with the metallic part, the lenticular medium is formed in a part of the contact layer, the contact layer comprises GaAs, and the vertical cavity surface emitting laser diode further comprises one of an AlAs layer and a GaInP layer immediately beneath the contact layer.

* * * * *